(12) United States Patent
Nobunaga et al.

(10) Patent No.: US 7,743,303 B2
(45) Date of Patent: Jun. 22, 2010

(54) DEFECTIVE MEMORY BLOCK REMAPPING METHOD AND SYSTEM, AND MEMORY DEVICE AND PROCESSOR-BASED SYSTEM USING SAME

(75) Inventors: Dean Nobunaga, Cupertino, CA (US); Hanqing Li, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 668 days.

(21) Appl. No.: 11/656,577

(22) Filed: Jan. 22, 2007

(65) Prior Publication Data

US 2008/0177933 A1 Jul. 24, 2008

(51) Int. Cl.
G01R 31/28 (2006.01)
G11C 29/00 (2006.01)
G06F 11/00 (2006.01)

(52) U.S. Cl. .............................. 714/736; 714/718; 714/8
(58) Field of Classification Search ...................... 714/8, 714/42, 718, 723, 736, 819, 2, 7, 100; 365/200, 365/185.33, 185.09; 711/115
See application file for complete search history.

(56) References Cited

U.S. PATENT DOCUMENTS

| | | | | |
|---|---|---|---|---|
| 7,159,141 B2* | 1/2007 | Lakhani et al. | ................ | 714/8 |
| 7,236,413 B2* | 6/2007 | Nishihara | .................... | 365/200 |
| 7,388,782 B2* | 6/2008 | Tokiwa | ................. | 365/185.09 |
| 7,434,122 B2* | 10/2008 | Jo | .............................. | 714/723 |
| 7,539,896 B2* | 5/2009 | Lakhani et al. | ................ | 714/8 |
| 7,571,362 B2* | 8/2009 | Pellicone et al. | ............ | 714/723 |
| 2005/0283657 A1* | 12/2005 | Nishihara | ....................... | 714/8 |
| 2009/0204847 A1* | 8/2009 | Lakhani et al. | ................ | 714/8 |

\* cited by examiner

*Primary Examiner*—Phung M Chung
(74) *Attorney, Agent, or Firm*—Dorsey & Whitney LLP

(57) ABSTRACT

A non-volatile memory device includes a block remapping system that offsets an input block address by the addresses of non-functional blocks to provide an output block address that is used to address the memory device. The system generates the output block addresses by, in effect, adding to the input block address the addresses of all non-functional blocks of memory that are between an initial address and the output block address. The system performs this function be comparing the input block address to the address of any defective block. If the address of the defective block is less than or equal to the input block address, the addresses of all defective blocks starting at the block address are added to the input block address. The system then iteratively performs this process using each output block address generated by the system in place of the input block address.

30 Claims, 5 Drawing Sheets

| BIT[0:10] | BIT[11:12] | BIT13 |
|---|---|---|
| BLOCK ADDRESS | BLOCK_SIZE | ENABLE |

FIGURE 3

| MULTIPLIER[2:0] \ BLOCK_SIZE[1:0] | 00 | 01 | 10 | 11 |
|---|---|---|---|---|
| 000 | 1 | 2 | 4 | 8 |
| 001 | 1 | 2 | 8 | 16 |
| 010 | 2 | 4 | 8 | 16 |
| 011 | 2 | 4 | 16 | 32 |
| 100 | 4 | 8 | 16 | 32 |
| 101 | 4 | 8 | 32 | 64 |
| 110 | 8 | 16 | 32 | 64 |
| 111 | 8 | 16 | 64 | 128 |

FIGURE 4

DEFECTIVE MEMORY BLOCK REMAPPING METHOD AND SYSTEM, AND MEMORY DEVICE AND PROCESSOR-BASED SYSTEM USING SAME

TECHNICAL FIELD

This invention relates generally to non-volatile memory devices, and more particularly, to a system and method for remapping to functional blocks of memory accesses to defective blocks of memory for erase, programming and read operations.

BACKGROUND OF THE INVENTION

Non-volatile memory is memory that can continue to store data after power is no longer provided to the memory. "Flash memory," called this because data can be erased from multiple memory cells simultaneously, is an example of non-volatile memory. A typical flash memory comprises an array of memory cells arranged in rows and columns. The array is divided into blocks of memory cells, with 2048 or 4096 blocks in a typical flash memory device. Although each of the cells within a block can be electrically programmed to store data individually, data is erased from the cells at the block level.

A common example of flash memory is NAND flash memory. The array of memory cells for NAND flash memory devices are arranged such that a control gate of each memory cell of a row of the array is connected to a word line. However, each memory cell is not directly connected to a column bit line. Instead, the memory cells of the array are arranged together in strings ("NAND strings"), with the memory cells connected together in series, source to drain, between a source line and a column bit line. The NAND strings in each block typically have as many as 32 memory cells between the source line and the column bit line.

The memory array for NAND flash memory devices is accessed by a row decoder activating a row of memory cells by selecting the word line connecting the control gates of the memory cells. In addition, the word lines connected to the control gates of unselected memory cells of each string are driven so that the respective memory cell passes current in a manner that is unrestricted by their stored data values. Current then flows from the source line to the column bit line through each series connected string, restricted only by the selected memory cells of each string. This places the current-encoded data values of the row of selected memory cells on the column bit lines to be sense and amplified before being output as data, as well known.

After memory devices have been fabricated, they normally undergo testing to determine if they are functioning properly. It is not uncommon to find that many memory cells in the device are defective. For example, in flash memory device, it is common for functional testing to reveal that one or more blocks of memory cells are defective. In order to increase the yield from each semiconductor die, memory devices, including flash memory devices, are normally manufactured with extra columns and extra blocks of memory cells, which are sometimes referred to as "redundant columns" and "redundant blocks," respectively. When a column or block of memory cells is found to be defective during testing, the defective column or block may be repaired by substituting a redundant column or block of memory cells. This is typically accomplished by programming a bank of fuses or anti-fuses with the address of the defective column or block. When an attempt is made to access the defective column or block, the corresponding address is detected, and the access is redirected to the redundant column or block, respectively.

The ability to perform post-fabrication repair of defective flash memory devices increases the die yield because it allows such devices to be sold. To further increase die yield and thereby minimize the cost of flash memory devices, standard specifications for NAND flash memory allow a manufacturer to sell NAND flash devices having a percentage of defective blocks of memory, which are referred to as "initial bad blocks" of memory. The bad blocks do not affect the performance of good blocks of memory because each block is independently accessible.

Generally the process of identifying initial bad blocks occurs during testing by the manufacturer. A conventional manner of marking the bad blocks is to program specific locations within each bad block with data that is used to indicate that the block is defective. Upon use of the memory device, a bad block disable process is performed. During this process, the specific locations are queried to identify which blocks of memory are bad. Control logic included in the memory device identifies the bad blocks by checking for the data that is indicative of a bad block. If such data is present, the block can be disabled using a conventional technique of setting a latch in the respective block decoder circuits for the bad block. Setting the latch prevents access to the bad block and provides a hardware mechanism for disabling bad blocks prior to operation. Although the technique of programming bad blocks with indicating data is effective in marking initial bad blocks, some users choose not to read the array for the bad block information prior to use, and simply erase the entire array. As a result, the data programmed to identify the bad blocks are erased, thus, eliminating any way to identify which blocks are bad after the erasing process. Also, this process requires that the user be involved in identifying of bad blocks and ensuring that they are not accessed. The user must therefore adapt a system containing the flash memory device to carry out these functions. Furthermore, if these functions are performed improperly, the flash memory device may provide erroneous data.

One approach to identifying bad blocks even in the case where the entire memory array is erased prior to use is to program initial bad block information in a user-inaccessible memory that is separate from the flash memory array. One technique is to program the initial bad block information into specific circuits designed to store this information. An example of this type of circuit is described in U.S. Pat. No. 5,864,499 to Roohparvar et al. The circuits described therein are small arrays of non-volatile memory cells having dedicated sense amplifiers. The memory cells can be programmed and function as "fuses" to store information identifying the initial bad blocks. One problem resulting from this approach is that as the number of memory blocks in a memory device increases, and there are a greater absolute number of bad blocks, the number of the dedicated "fuse circuits" must also increase. The additional fuse circuits occupy more space on the die, which is generally undesirable.

There is therefore a need for a system and method for identifying initial bad blocks and remapping accesses to initial bad blocks in a manner that is transparent to the user and does not require a large number of dedicated fuse circuits even though the memory device contains a large number of potentially defective blocks.

BRIEF DESCRIPTION OF THE DRAWINGS

FIG. 3 is a table showing one example of mapping data provided by a fuse bank in the block remapping system of FIG. 2.

FIG. 4 is a table showing one example of a technique for designating the number of contiguous bad blocks starting at a specific block address that may be used in the block remapping system of FIG. 2.

DETAILED DESCRIPTION

Figure 1:
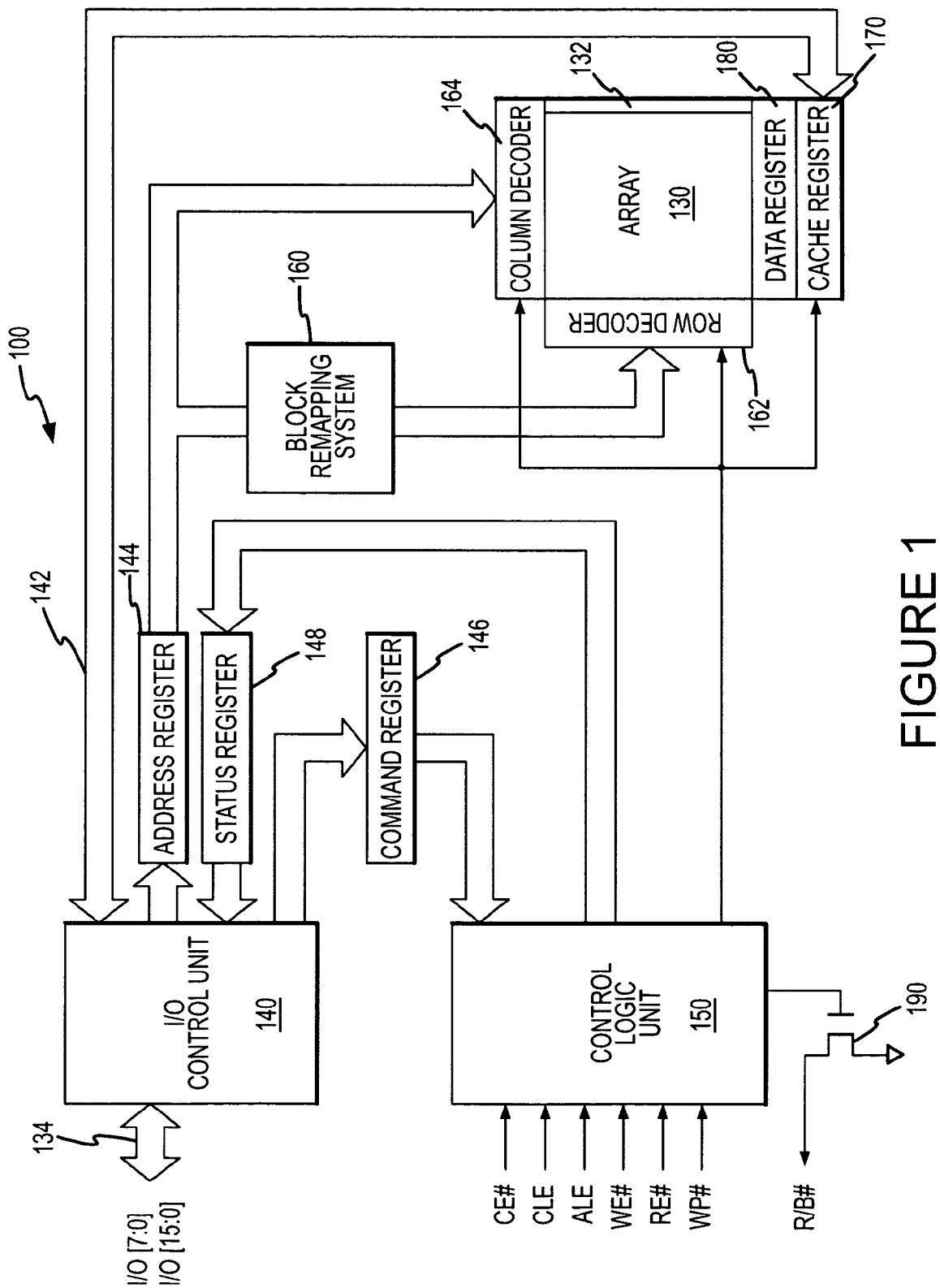
FIG. 1 is a block diagram of a flash memory device according to one example of the invention.

A flash memory device 100 according to one example of the invention is shown in FIG. 1. The flash memory device 100 includes an array 130 of flash memory cells arranged in rows and columns. The array 130 is divided into a large number of blocks, each of which contains a specific number of rows of the array 130. The flash memory cells in the array 130 have their control gates coupled to respective word lines, and NAND strings of memory cells in each block are connected in series, source to drain, between a source line and a respective column bit line. The flash memory array 130 may contain, for example, 2048 or 4096 blocks of memory cells.

The memory device 100 includes an I/O bus 134 through which sequential input/output ("I/O") signals corresponding to memory commands, addresses and write data are applied to the memory device 100. Similarly, I/O signals corresponding to read data are output from the flash memory device 100 through the I/O bus 134. The I/O bus is connected to an I/O control unit 140 that routes the signals between the I/O bus 134 and an internal data bus 142, an address register 144, a command register 146 and a status register 148.

The flash memory device 100 also includes a control logic unit 150 that receives a number of control signals, including an active low chip enable signal CE#, a command latch enable signal CLE, an address latch enable signal ALE, an active low write enable signal WE#, an active low read enable signal RE#, and an active low write protect WP# signal. When the chip enable signal CE# is active low, I/O signals corresponding to commands, addresses and data may be transferred between the memory device 100 and a memory access device (not shown). When the command latch enable signal CLE is active high and the ALE signal is low, the control logic unit 150 causes the I/O control unit 140 to route signals received through the I/O bus 134 to the command register 146 responsive to the rising edge of the WE# signal. Similarly, when the address latch enable signal ALE is active high and the CLE signal is low, the I/O control unit 140 routes signals received through the I/O bus 134 to the address register 144 responsive to the rising edge of the WE# signal. The write enable signal WE# is also used to gate signals corresponding to write data from the memory access device (not shown) to the memory device 100, and the read enable signal RE# is used to gate signals corresponding to read data from the memory device 100 to the memory access device (not shown). The I/O control unit 140 transfers signals corresponding to write data and read data between the I/O bus 134 and the internal data bus 142 when the CLE and ALE signals are both low. Finally, an active low write protect signal WP# prevents the memory device 100 from inadvertently performing programming or erase functions.

The status register 148 can be read responsive to a read status command. After the read status command, all subsequent read commands will result in status data being read from the status register 148 until a subsequent page read command is received. The status data read from the status register 148 provides information about the operation of the memory device 100, such as whether programming and erase operations were completed without error.

The address register 144 stores address signals corresponding to rows and columns of memory cells in the array 130. The address register 144 then outputs signals corresponding to an addressed row to a block remapping system 160. As explained in greater detail below, when the block remapping system 160 receives each address, it executes a remapping procedure. This remapping procedure uses information stored in the system 160 that identifies the bad blocks to translate the address of a row in a bad block to an address of a row that is in a good block. As also explained in further detail below, the system 160 performs the remapping process by decoding extra, redundant blocks of memory cells as an extension of the array 130 and uses them to map over bad blocks if necessary. The block remapping system 160 includes repair fuse sets (not shown in FIG. 2), each of which contains information identifying the starting address of a bad block and the number of contiguous bad blocks following the identified bad block. Each of the relatively few fuse sets can be used to identify any of the relatively large number of blocks that may be defective. As a result, and because one fuse set can also identify a large number of contiguous bad blocks, the block remapping system 160 requires only a relatively small number of fuse sets. As further explained below, the entire remapping process is transparent to the user, and a system containing the memory device 100 need not be specially adapted to accommodate the block remapping system 160. More specifically, an address map for the memory device 100 shows one contiguous address space of only good blocks, thereby freeing the user of the need to tag bad blocks, which are no longer accessible to the user.

After the address signals stored in the address register 144 have been remapped if necessary by the block remapping system 160, signals corresponding to the remapped address are applied to a row decoder 162, and the column address signals to a column decoder 164. The row decoder 162 asserts the word line corresponding to the decoded row address. Similarly, the column decoder 164 enables write data signals to be applied to bit lines for columns corresponding to the column address and allows read data to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the signals corresponding to a row address have been loaded into the address register 144 and output from the block remapping system 160, the I/O control unit 140 routes signals corresponding to write data to a cache register 170. The write data signals are stored in the cache register 170 in successive sets each having a size corresponding to the width of the I/O bus 134. The cache register 170 sequentially stores the sets of write data signals for an entire row or page of memory cells in the array 130. All of the stored write data signals are then used to program a row or page of memory cells in the array 130 selected by the row address output from the block remapping system 160. In a similar manner, during a read operation, read data signals from a row or page of memory cells selected by the row address stored in the address register 144 and output from the block remapping system 160 are stored in a data register 180. Sets of data signals corresponding in size to the width of the I/O bus 134 are then sequentially transferred through the I/O control unit 140 from the data register 180 to the I/O bus 134. Although the array 130 is typically read on a row-by-row or page-by-page basis, a selected portion of a selected row or page may be read by specifying a corresponding column address.

The flash memory device 130 also includes an NMOS transistor 190 having its gate coupled to receive a signal from the control logic unit 150. When the memory device 100 is busy processing a programming, erase or read command, the control logic unit 150 outputs a high signal to cause the transistor 190 to output an active low readibusy signal R/B#. At other times, the transistor 190 is turned OFF to indicate to a memory access devices that the device 100 is able to accept and process memory commands.

Figure 2:
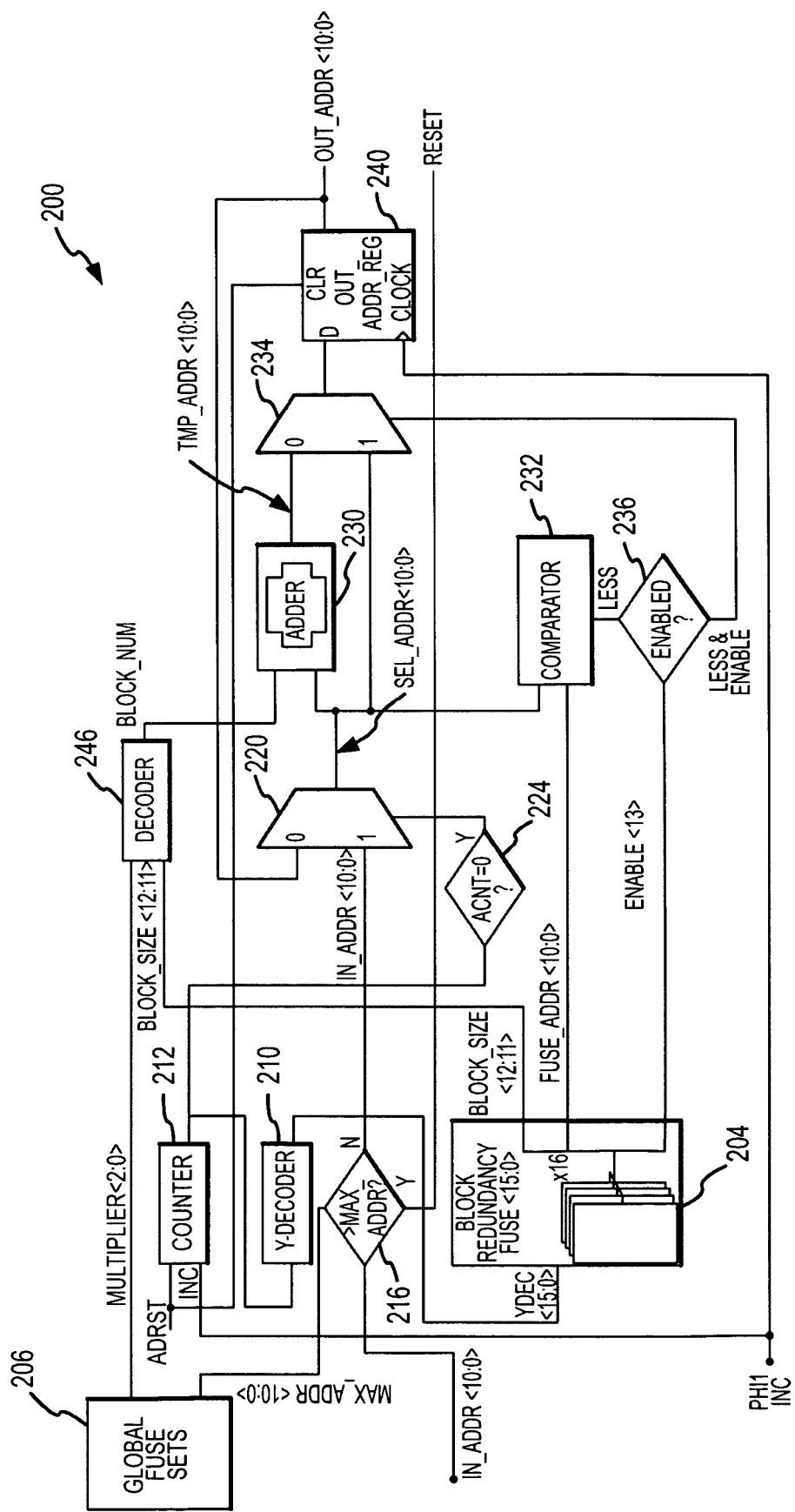
FIG. 2 is a block diagram of one example of a block remapping system that may be used in the flash memory device of FIG. 1.

A block remapping system 200 according to one example of the invention is shown in FIG. 2. The block remapping system 200 may be used as the block remapping system 160 in the memory device of FIG. 1, or in some other non-volatile memory device, such as a flash memory, in which the rows of memory cells are divided into multiple blocks. The block remapping system 200 performs a block remapping process responsive to each read, program and erase operation in a memory device containing the system 160. The block remapping system 200 includes 16 block redundancy fuse sets 204 that are accessed responsive to a corresponding one of 16 decoder signals YDEC<15:0>. As shown in FIG. 3, when each fuse set is accessed, it outputs a 14-bit signal that consists of an 11-bit block address FUSE_ADDR<10:0>, which corresponds to the address of a defective block, a 2-bit BLOCK_SIZE<12:11>, which specifies the number of rows in each block, and an ENABLE<13> bit, which causes the block remapping system 200 to treat E. coli the block designated by the 11-bit block address FUSE_ADDR<10:0> as being defective. The 16 values of block address FUSE_ADDR<10:0> are stored in the fuse sets 204 in a manner that causes them to be accessed by values of YDEC<15:0> in ascending order. As a result, the fuse sets 204 outputs addresses of bad blocks from bad blocks having lower addresses to bad blocks having higher addresses.

The block remapping system also includes global fuse sets 206, which provides two pieces of information. First, it outputs a 3-bit MULTIPLIER<2:0>, which is used by the system 200 to increase the block size corresponding to the BLOCK_SIZE<12:11> bits to a higher number. Second, it outputs an 11-bit MAX_ADDR<10:0> designating the highest numbered block in the memory device containing the system 200. The value of MAX_ADDR<10:0> corresponds to all of the blocks in the memory device, including the redundant blocks. Both of the items of information stored in the global fuse sets 206 are specific to a specific memory device, and the fuse sets 206 may be programmed during post-fabrication testing when the fuse sets 204 are programmed. Although fuse sets 204, 206 would normally be programmed during post-fabrication testing, the global fuse sets 206 may alternatively be programmed during fabrication.

The values of YDEC<15:0>, which are used to access the block redundancy fuse sets 204, are provided by a y-decoder 210. The y-decoder 210 receives 4 bits ACNT<3:0> from a counter 212, and decodes the 4 bits into one of the 16 YDEC<15:0>, which select a corresponding one of the 16 fuse sets 204. The counter 212 is incremented by a clock signal INC that is present in the memory device containing the system 200. The counter begins incrementing in response to an address reset signal ADRST, which occurs each time the address register 144 applies an address IN_ADDR<10:0> to the block remapping system 200. A comparator 216 first compares the address IN_ADDR<10:0> to the maximum block address MAX_ADDR<10:0> stored in the global fuse sets 206. If IN_ADDR<10:0> is for a value greater than the value of MAX_ADDR<10:0>, the comparator 216 outputs a RESET signal in the memory device containing the system 200 to abort the operation for which IN_ADDR<10:0> was provided. If IN_ADDR<10:0> is for a value less than or equal to the value of MAX_ADDR<10:0>, the comparator 216 applies the address IN_ADDR<10:0> to one input of a multiplexer 220.

When the lowest bad block address value FUSE_ADDR<10:0> is output from the block redundancy fuse sets 204 responsive to the zero value of ACNT<3:0>, this zero value of ACNT<3:0> is detected by a comparator 224, which controls the operation of the multiplexer 220. In response to the zero value of ACNT<3:0>, the comparator 224 causes the multiplexer 220 to output the IN_ADDR<10:0> received from the comparator 216 as a selected address SEL_ADDR<10:0>.

The SEL_ADDR<10:0> is applied to one input of an adder 230, to a comparator 232, and to one input of a multiplexer 234, which receives the output of the adder 230 as its other input. The comparator 232 compares the value of SEL_ADDR<10:0> to the value of FUSE_ADDR<10:0>, which, in response to the initially generated ACNT<3:0>=0, is the value of the lowest defective block of memory cells. If the value of SEL_ADDR<10:0> is less than the value of FUSE_ADDR<10:0>, it means there are no defective blocks between block 0 and the block indicated by the currently received IN_ADDR<10:0>. In such case, no remapping is required. Therefore, the comparator 232 outputs a signal to a comparator 236, which determines if the ENABLE bit from the block redundancy fuse set 204 is true. If so, the comparator 236 outputs a control signal to the multiplexer 234 that causes it to pass SEL_ADDR<10:0> to the input of an output address register 240. The output address register 240 then outputs SEL_ADDR<10:0> as an output address OUT_ADDR<10:0>, which is applied to the row decoder 162 (FIG. 1). Therefore, as long as there were no bad blocks between block 0 and the block corresponding to IN_ADDR<10:0>, IN_ADDR<10:0> is used as OUT_ADDR<10:0>.

When the next IN_ADDR<10:0> is received, the above-described process is repeated. Let us assume in this case that there is at least one bad block between block 0 and the block corresponding to IN_ADDR<10:0>. The comparator 232 will detect such case since the value of SEL_ADDR<10:0> will be less than the value of FUSE_ADDR<10:0>. The comparator 232 will therefore cause the multiplexer 234 to couple the output of the adder 230 to the output address register 240. However, the system must determine how many bad blocks there are between block 0 and the block corresponding to IN_ADDR<10:0>. For this reason, a decoder 246 provides a BLOCK_NUM indication corresponding to the number of bad blocks starting at the block address corresponding to the lowest bad block address FUSE_ADDR<10:0> since acnt<3:0>=0 is initially used to access the block redundancy fuse sets 204. The decoder 246 is able to determine the number of bad blocks based upon the BLOCK_SIZE indication from the fuse sets 204 and the MULTIPLIER value from the global fuse sets 206.

The manner in which BLOCK_NUM is determined based upon the BLOCK_SIZE and MULTIPLIER is shown in FIG. 4. For example, if the MULTIPLIER is "000," the block size is 1, 2, 4, and 8 for an increasing series of two binary numbers. However, if the MULTIPLIER is "011," then the block sizes corresponding to "00" and "01" are multiplied by 2, and the block sizes corresponding to "10" and "11" are multiplied by 4.

Once the decoder 246 has determined the number of bad blocks between block 0 and the block corresponding to IN_ADDR<10:0>, the adder outputs a value of TMP_ADDR<10:0> that has a value equal to the sum of the value of IN_ADDR<10:0> and the value corresponding to BLOCK_SIZE. This sum TMP_ADDR<10:0> corresponds to the physical address of potentially the good block of memory cells that should be accessed by IN_ADDR<10:0> since TMP_ADDR<10:0> is offset from IN_ADDR<10:0> by the number of bad blocks indicated by the BLOCK_NUM value. For example, if IN_ADDR<10:0> has a value of 80, FUSE_ADDR<10:0> has a value of 35, and BLOCK_NUM is equal to 4, the physical address of the block that should be accessed is 84, assuming there were no bad blocks between block 39 and block 84. The next good block following the first block, i.e., block 39, should not be used because that block would be accessed by an IN_ADDR<10:0> with a value of 35.

As mentioned above, there may be one or more additional contiguous bad blocks between the lowest non-defective block identified using the first value of FUSE_ADDR<10:0> and the initially remapped block corresponding to IN_ADDR<10:0> (in the above example, between block 39 and block 84. For this reason, the counter 212 is incremented on the next cycle of INC, and the above-described process is repeated. Each time the comparator 232 compares the value of IN_ADDR<10:0> to the next value of FUSE_ADDR<10:0>. If the value of IN_ADDR<10:0> is greater than or equal to the next value of FUSE_ADDR<10:0>, the value of TEMP_ ADDR<10:0> is incremented with a value corresponding to the size of a defective block, as described above. Eventually, as long as there are not an excessive number of bad blocks, the comparator 232 will determine that IN_ADDR<10:0> is less than the value of the current FUSE_ADDR<10:0>. In such case, the process terminates, and the current value of TMP_ADDR<10:0> stored in the output address register 240 is used by the row decoder 162 (FIG. 1) as OUT_ADDR<10:0>>.

Figure 5:
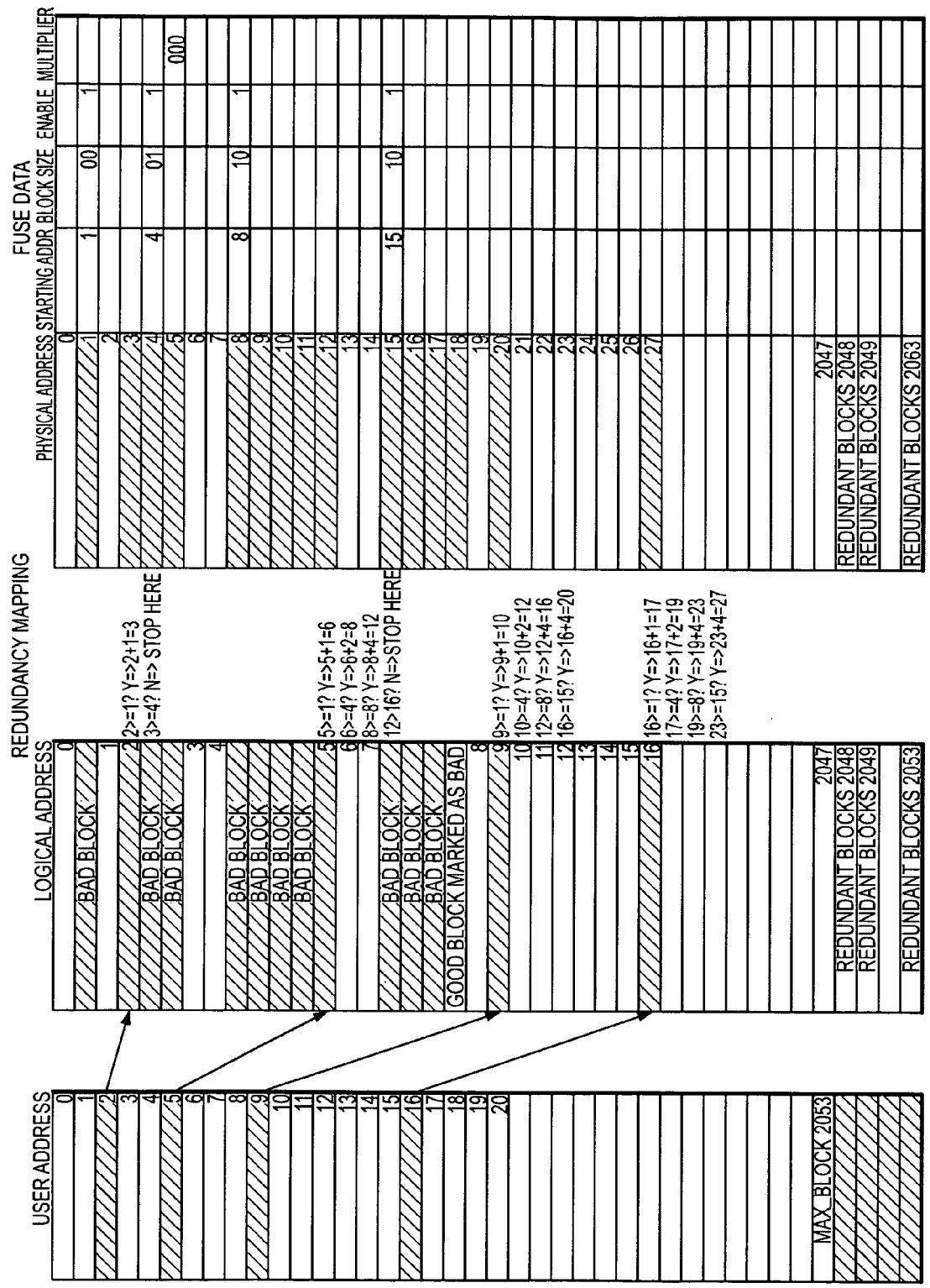
FIG. 5 is a table showing various examples of bad block remapping using the block remapping system of FIG. 2.

Some specific examples showing the operation of the block remapping system 200 in a flash memory device having 10 bad blocks is shown in FIG. 5. The left hand column of FIG. 5 shows the user addresses corresponding to IN_ADDR<10:0>, the next column shows the addresses of the bad blocks and the logical addresses to which the user addresses must be remapped, the next column shows the remapped physical addresses corresponding to the user addresses, and the column on the right shows the information stored in the block redundancy fuse sets 204 and the multiplier stored in the global fuse sets 206, which is a multiplier of 1.

In the first example, IN_ADDR<10:0> corresponds to block 2, and the FUSE_ADDR<10:0> for the first bad block corresponds to block 1. Therefore, the comparator 232 determines that the value of IN_ADDR<10:0> is not less than the value of FUSE_ADDR<10:0>, which is indicative of one or more bad blocks between block 0 and block 2. The block size ("00") for the bad block starting at FUSE_ADDR<10:0> is then used by the decoder 246 to produce a value of BLOCK_NUM equal to 1. The adder 230 therefore adds the block size of 1 to the value of 2 for IN_ADDR<10:0> to obtain a TMP_ADDR<10:0> of 3. Since the value of IN_ADDR<10:0> is not less than the value of FUSE_ADDR<10:0>, the comparator 232 causes the multiplexer 234 to output the TMP_ADDR<10:0> to the data input of the output address register 240.

The next cycle of INC latches the TMP_ADDR<10:0> of 3 to the output of the output address register 240, which is fed back to the multiplexer 220. The next cycle of INC makes ACNT no longer equal to 0, so the multiplexer 220 makes the output SEL_ADDR<10:0> equal to the value (3) of TMP_ADDR<10:0>. The next cycle of INC also increments the counter 212 to the FUSE_ADDR<10:0> value 4 of FUSE_ADDR<10:0> is compared to the SEL_ADDR<10:0> value of 3 by the comparator 232. Since the value (3) of SEL_ADDR<10:0> is less than the value (4) of FUSE_ADDR<10:0>, the comparator 232 causes the multiplexer 234 to output the SEL_ADDR<10:0>> value of 3 to the input of the output address register 240. The next INC pulse latches the SEL_ADDR<> value (3) to the output of the output address register 240. The process then continues with INC incrementing the counter 212 until the 16$^{th}$ FUSE_ADDR<10:0> value is output from the block redundancy fuse sets. However, in each case, the value (3) of SEL_ADDR<10:0> will less than the value of FUSE_ADDR<10:0>, so the comparator 232 will causes the multiplexer 234 to finally output the OUT_ADDR<10:0>> value of 3. Therefore, the user address of 2 is remapped to a physical address of 3. Alternatively, the process of mapping bad blocks could end the first time that the comparator 232 detects an SEL_ADDR<10:0> that is less than the value of FUSE_ADDR<10:0>.

In the next example, the user address IN_ADDR<10:0> is for block 5. After the comparison is made with the value (1) of FUSE_ADDR<10:0> for the first bad block as explained in the first example, the adder 230 will produce a value of 6 (5+1) for TMP_ADDR<10:0> since the comparator 224 will cause the multiplexer 220 to the output the IN_ADDR<10:0> of 5 to the adder 230, and the adder 230 will add the bad block size of 1 for bad block 1, as explained above. The next cycle of INC increments the counter 212 so that ACNT is no longer equal to 0. As a result, the comparator 224 causes the multiplexer 220 to couple OUT_ADDR<10:0> to the adder 230 and to the comparator 232. The comparator 232 then compares this value (6) with the value 4 of the next of FUSE_ADDR<10:0>, as explained above. The comparator 232 determines that the value (6) is not less than the value (4) of FUSE_ADDR<10:0>. Therefore, the value of IN_ADDR<10:0> must be offset by the number of any additional bad blocks between block 1 and block 6 to obtain the value of OUT_ADDR<10:0>. The adder 230 then uses the block_size "01," which is equal to 2, to add to the current value 6 of OUT_ADDR<10:0> to produce a new value of 8 from the output address register 240. This value (8) is fed back to the multiplexer on the next INC pulse to become the new value of SEL_ADDR<10:0>. The comparator 232 then determines that the next value of FUSE_ADDR<10:0>, which is 8, is not greater than the SEL_ADDR<10:0> value of 8. Therefore, the bad blocks starting at block 8 must be added to SEL_ADDR<10:0> value of 8. The decoder 246 provides a block size value BLOCK_NUM of "10," which the adder 230 sums with the SEL_ADDR<10:0> value of 8 to obtain a new TMP_ADDR<10:0> of 12. On the next INC pulse, the TMP_ADDR<10:0> value of 12 is fed back through the multiplexer to become the next SEL_ADDR<10:0> value. The next INC pulse also increments the counter 212 so that the block redundancy fuse sets 204 outputs the fourth FUSE_ADDR<10:0> value of 15. This value (15) is compared to the new value (12) of SEL_ADDR<10:0> by the comparator. Since FUSE_ADDR<10:0> is now greater than SEL_ADDR<10:0>, the value (12) of SEL_ADDR<10:0> continues to be used as OUT_ADDR<10:0> for the fourth and all remaining values of FUSE_ADDR<10:0>. Thus, the input block address IN_ADDR<10:0> of 5 is mapped to block 12.

In the same manner as explained above, the next user block address IN_ADDR<10:0> of 9 is mapped to block 20, and the user block address IN_ADDR<10:0> of 16 is mapped to block 27. In each case, the block remapping system 200 provides a remapped output address that is obtained by, in effect, adding to the received user block address IN_ADDR<10:0> any addresses corresponding to the sizes of any and all non-functional blocks of memory cells having respective addresses that are lower than or equal to the final output address. Thus, for example, the IN_ADDR<10:0> of 9 is added to the 11 bad blocks between block 0 and block 20 to provide a remapped output address of 20. Conversely, the number of bad blocks is equal to the final output address less the value of IN_ADDR<10:0>.

Figure 6:
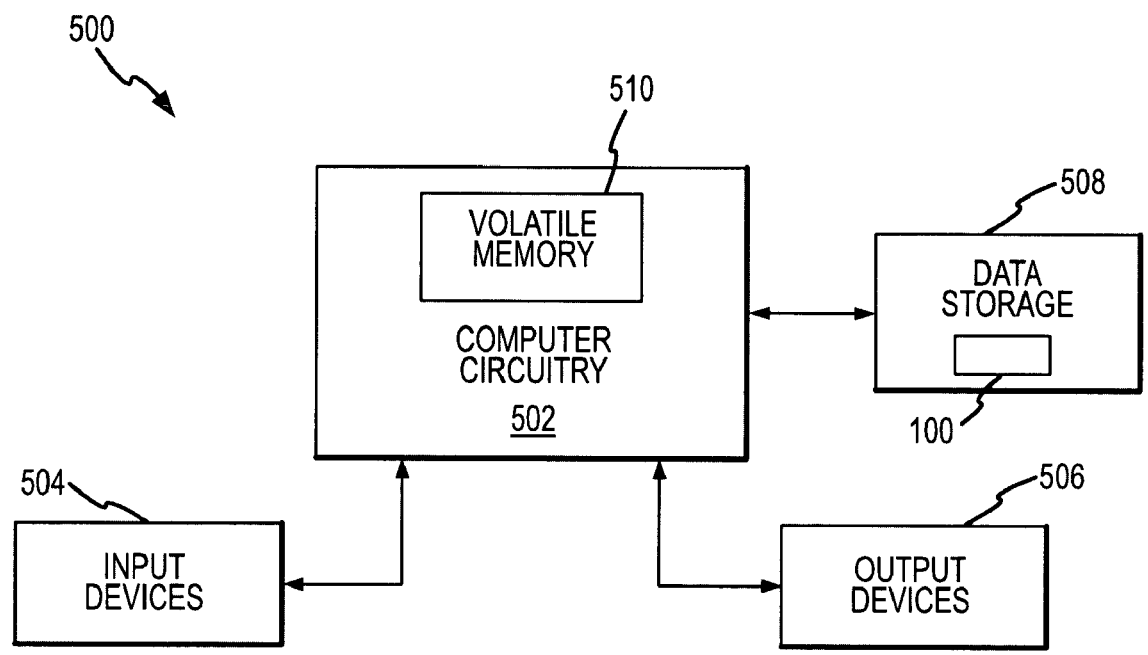
FIG. 6 is a block diagram of a processor-based system using the flash memory device of FIG. 1 or a non-volatile memory device according to another example of the invention.

FIG. 6 is a block diagram of a processor-based system 500 using the flash memory device of FIG. 1 or a non-volatile memory device according to another example of the invention. The processor-based system 500 includes processor circuitry 502 having volatile memory 510. The processor circuitry 502 is coupled through address, data, and control buses to the volatile memory 510 to provide for writing data to and reading data from the volatile memory 510. The processor circuitry 502 includes circuitry for performing various processing functions, such as executing specific software to perform specific calculations or tasks. The processor-based system 500 also includes one or more input devices 504 coupled to the processor circuitry 502 to allow an operator to interface with the processor-based system 500. Examples of input devices 504 include keypads, touch screens, and scroll wheels. The processor-based system 500 also includes one or more output devices 506 coupled to the processor circuitry 502 to provide output information to the operator. In one embodiment, the output device 506 is a visual display providing visual information to the operator. Data storage 508 is also coupled to the processor circuitry 502 to store data that is to be retained even when power is not supplied to the processor-based system 500 or to the data storage 508. The NAND flash memory 100, or another embodiment of a NAND flash memory according to the present invention, can be used for the data storage 508.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of addressing a memory device having blocks of non-volatile memory cells, the method comprising:
   keeping a record of the respective addresses of all blocks of memory cells in the memory device that are non-functional;
   receiving a block address corresponding to a block of the memory cells;
   using the received block address as a comparison block address;
   when the block address is received, comparing the comparison block address with the block addresses in the kept record, the block addresses in the kept record being compared to the comparison block address in order from a lowest address to a highest address;
   for a block address in the kept record that is found by the comparison to be lower than or equal to the comparison block address, adding to the comparison block address a number corresponding to a size of the non-functional block to provide an output block address; and
   using the output block address to address the memory device.

2. The method of claim 1 wherein the record of the respective addresses of all blocks of memory cells in the memory device that are non-functional further contains a record of the size of each non-functional block, and wherein the act of adding to the comparison block address a number corresponding to size of the non-functional block comprises adding to the comparison block address the record of the size of the non-functional block.

3. The method of claim 1, further comprising:
   if a block address in the kept record was found to be lower than or equal to the comparison block address, using the output address as a subsequent comparison block address;
   compare the subsequent comparison block address with the block addresses in the kept record;
   for each block address in the kept record that is found to be lower than or equal to each subsequent comparison block address, adding the subsequent comparison block address a number corresponding to size of the non-functional block to provide an output block address;
   performing the above acts until a block address in the kept record is found to be greater than a subsequent comparison block address; and
   using the output block address to address the memory device.

4. The method of claim 1 wherein the act of keeping the record of the respective addresses of all blocks of memory cells in the memory device that are non-functional comprises associating each of the addresses in the record with an index number, the index numbers being assigned to the addresses in order from a lowest index number associated with the lowest address to a highest index number associated with the highest address.

5. The method of claim 4 wherein the act of comparing the comparison block address with the block addresses in the kept record comprises:
   successively incrementing the index number from the lowest index number to the highest index number;
   using the index numbers to obtain the respective addresses from the kept record; and
   comparing the comparison block address with each of the obtained addresses.

6. A method of addressing a memory device having blocks of non-volatile memory cells, the method comprising:
   keeping a record of the respective block addresses of all blocks of memory cells in the memory device that are non-functional;
   receiving a block address corresponding to a block of the memory cells;
   providing an output block address corresponding to a sum of the received block address and a sum of addresses corresponding to the sizes of all non-functional blocks of memory cells having respective block addresses in the kept record that are lower than or equal to the received block address; and
   using the output block address to address the memory device.

7. The method of claim 6 wherein the act of providing the output block address comprises:
- comparing the received block address with the block addresses in the kept record, the block addresses being compared in order from a lowest block address to a highest block address; and
- if a block address in the kept record that is found by the comparison to be lower than or equal to the received block address, adding to the received address an address corresponding to size of the block corresponding to the block address.

8. The method of claim 6 wherein the act of keeping a record of the respective block addresses of all blocks of memory cells in the memory device that are non-functional comprises keeping the record of the respective block addresses in order from a lowest block address to a highest block address.

9. The method of claim 6 wherein the act of keeping a record of the respective addresses of all blocks of memory cells in the memory device that are non-functional comprises associating each of the addresses in the record with an index number, the index numbers being assigned to the addresses in order from a lowest index number associated with the lowest address to a highest index number associated with the highest address.

10. The method of claim 6 wherein the record of the respective addresses of all blocks of memory cells in the memory device that are non-functional further contains a record of the size of each non-functional block.

11. A block remapping system for a non-volatile memory device having memory cells arranged in blocks each of which is associated with a respective block address, the system comprising:
- a storage device containing a record of the address of each block of memory cells that is non-functional;
- a first comparator coupled to the storage device, the first comparator being configured to compare a received block address with at least some of the block addresses contained in the storage device, the first comparator being configured to compare the received block address with the block addresses contained in the storage device in order from a lowest address to a highest address;
- a first adder configured to receive the received block address and being configured to receive a block size value corresponding to the size of each non-functional block having a respective address contained in the storage device, the first adder being configured to add to the received block address the block size value corresponding to any block having a block address found by the first comparator to be smaller than or equal to the received block address; and
- an output device coupled to the first adder and being configured to provide as an output block address the block addresses added by the adder.

12. The block remapping system of claim 11 wherein the storage device comprises:
- an electronic record of non-functional block addresses each of which is associated with a respective index number, the index numbers being assigned to the non-functional block addresses in order from a lowest index number associated with a lowest non-functional block address to a highest index number associated with a highest non-functional block address; and
- a counter coupled to the electronic record of non-functional block addresses, the counter being configured responsive to being clocked to generate and apply to the electronic record an incrementing sequence of the index numbers.

13. The block remapping system of claim 12 wherein the electronic record comprises sets of fuses that may be selectively programmed to correspond to the non-functional block addresses.

14. The block remapping system of claim 12 wherein the electronic record further contains a record of the size of each block having a non-functional block addresses contained in the electronic record.

15. The block remapping system of claim 11, further comprising:
- a second comparator coupled to the storage device, the second comparator being configured to compare each output block address with at least some of the block addresses contained in the storage device, the second comparator being configured to compare each output block address with the block addresses contained in the storage device in order from a lowest address to a highest address; and
- a second adder coupled to receive each output block address and being configured to receive a block size value corresponding to the size of each non-functional block having a respective address contained in the storage device, the second adder being configured to add to each output block address the block size value corresponding to any block having a block address found by the first comparator to be smaller than or equal to the output block address.

16. The block remapping system of claim 15 wherein a same comparator is used as the first comparator and the second comparator, and a same adder is used as the first adder and the second adder.

17. A non-volatile memory device, comprising:
- a signal bus;
- a bus interface configured to receive signals from the signal bus indicative of a memory command and a memory address, the bus interface further being configured to receive signals from the signal bus corresponding to write data and to output signals to the signal bus indicative of read data;
- an array of non-volatile memory cells arranged in blocks each of which is associated with a respective block address;
- a control logic unit coupled to the bus interface and the array of non-volatile memory cells, the control logic being configured to carry out operations in the array corresponding to a memory command at a location in the array corresponding to a memory address;
- a storage device containing a record of the address of each block of memory cells that is non-functional;
- a first comparator coupled to the storage device, the first comparator being configured to compare a received block address with at least some of the block addresses contained in the storage device, the first comparator being configured to compare the received block address with the block addresses contained in the storage device in order from a lowest address to a highest address;
- a first adder configured to receive the received block address and being configured to receive a block size value corresponding to the size of each non-functional block having a respective address contained in the storage device, the first adder being configured to add to the received block address the block size value corresponding to any block having a block address found by the first comparator to be smaller than or equal to the received block address; and an output device coupled to the first adder and being configured to provide as an output block address the block addresses added by the adder.

18. The memory device of claim 17 wherein the storage device comprises:

an electronic record of non-functional block addresses each of which is associated with a respective index number, the index numbers being assigned to the non-functional block addresses in order from a lowest index number associated with a lowest non-functional block address to a highest index number associated with a highest non-functional block address; and a counter coupled to the electronic record of non-functional block addresses, the counter being configured responsive to being clocked to generate and apply to the electronic record an incrementing sequence of the index numbers.

19. The memory device of claim 18 wherein the electronic record comprises sets of fuses that are configured to be selectively programmed to correspond to the non-functional block addresses.

20. The memory device of claim 18 wherein the electronic record further contains a record of the size of each non-functional block having a block addresses contained in the electronic record.

21. The memory device of claim 17, further comprising:

a second comparator coupled to the storage device, the second comparator being configured to compare each output block address with at least some of the block addresses contained in the storage device, the second comparator being configured to compare each output block address with the block addresses contained in the storage device in order from a lowest address to a highest address; and a second adder coupled to receive each output block address and being configured to receive a block size value corresponding to the size of each non-functional block having a respective address contained in the storage device, the second adder being configured to add to each output block address the block size value corresponding to any block having a block address found by the first comparator to be smaller than or equal to the output block address.

22. The memory device of claim 21 wherein a same comparator is used as the first comparator and the second comparator, and a same adder is used as the first adder and the second adder.

23. The memory device of claim 17 wherein the non-volatile memory cells comprises flash memory cells.

24. A processor-based system, comprising:

a processor configured to process data and to provide memory commands and addresses;

an input device coupled to the processor;

an output device coupled to the processor; and a non-volatile memory device, comprising:

a signal bus;

a bus interface configured to receive signals from the signal bus indicative of a memory command and a memory address, the bus interface further being configured to receive signals from the signal bus corresponding to write data and to output signals to the signal bus indicative of read data;

an array of non-volatile memory cells arranged in blocks each of which is associated with a respective block address;

a control logic unit coupled to the bus interface and the array of non-volatile memory cells, the control logic being configured to carry out operations in the array corresponding to a memory command at a location in the array corresponding to a memory address;

a storage device containing a record of the address of each block of memory cells that is non-functional;

a first comparator coupled to the storage device, the first comparator being configured to compare a received block address with at least some of the block addresses contained in the storage device, the first comparator being configured to compare the received block address with the block addresses contained in the storage device in order from a lowest address to a highest address; and a first adder configured to receive the received block address and being configured to receive a block size value corresponding to the size of each non-functional block having a respective address contained in the storage device, the first adder being configured to add to the received block address the block size value corresponding to any block having a block address found by the first comparator to be smaller than or equal to the received block address, and to provide an output address equal to a sum of the received block address and the block size value corresponding to any block having a block address found by the first comparator to be smaller than or equal to the received block address.

25. The processor-based system of claim 24 wherein the storage device comprises:

an electronic record of non-functional block addresses, each of the non-functional block addresses being associated with a respective index number, the index numbers being assigned to the non-functional block addresses in order from a lowest index number associated with a lowest non-functional block address to a highest index number associated with a highest non-functional block address; and a counter coupled to the electronic record of non-functional block addresses, the counter being configured responsive to being clocked to generate and apply to the electronic record an incrementing sequence of the index numbers.

26. The processor-based system of claim 25 wherein the electronic record comprises sets of fuses that are configured to be selectively programmed to correspond to the non-functional block addresses.

27. The processor-based system of claim 25 wherein the electronic record further contains a record of the size of each non-functional block having a block addresses contained in the electronic record.

28. The processor-based system of claim 24, further comprising:

a second comparator coupled to the storage device, the second comparator being configured to compare each output block address with at least some of the block addresses contained in the storage device, the second comparator being configured to compare each output block address with the block addresses contained in the storage device in order from a lowest address to a highest address; and a second adder coupled to receive each output block address and being configured to receive a block size value corresponding to the size of each non-functional block having a respective address contained in the storage device, the second adder being configured to add to each output block address the block size value corresponding to any block having a block address found by the first comparator to be smaller than or equal to the output block address.

29. The processor-based system of claim 28 wherein a same comparator is used as the first comparator and the second comparator, and a same adder is used as the first adder and the second adder.

30. The processor-based system of claim 24 wherein the non-volatile memory cells comprises flash memory cells.

* * * * *

UNITED STATES PATENT AND TRADEMARK OFFICE
CERTIFICATE OF CORRECTION

| | | |
|---|---|---|
| PATENT NO. | : 7,743,303 B2 | Page 1 of 1 |
| APPLICATION NO. | : 11/656577 | |
| DATED | : June 22, 2010 | |
| INVENTOR(S) | : Dean Nobunaga et al. | |

It is certified that error appears in the above-identified patent and that said Letters Patent is hereby corrected as shown below:

On the Title page, in field (57), under "Abstract", in column 2, line 8, delete "be" and insert -- by --, therefor.

Signed and Sealed this

Twenty-fourth Day of August, 2010

David J. Kappos
*Director of the United States Patent and Trademark Office*